US 7,583,554 B2

(12) United States Patent
Hoefler

(10) Patent No.: US 7,583,554 B2
(45) Date of Patent: Sep. 1, 2009

(54) INTEGRATED CIRCUIT FUSE ARRAY

(75) Inventor: Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 152 days.

(21) Appl. No.: 11/681,421

(22) Filed: Mar. 2, 2007

(65) Prior Publication Data

US 2008/0212387 A1 Sep. 4, 2008

(51) Int. Cl.
*G11C 17/18* (2006.01)
(52) U.S. Cl. .................. 365/225.7; 365/185.18
(58) Field of Classification Search ............. 365/225.7, 365/185.18
See application file for complete search history.

(56) References Cited

U.S. PATENT DOCUMENTS

| | | | |
|---|---|---|---|
| 3,611,319 A | 10/1971 | Hyatt | |
| 5,270,983 A | 12/1993 | Wuertz et al. | |
| 5,444,650 A | 8/1995 | Abe et al. | |
| 5,619,469 A | 4/1997 | Joo | |
| 6,208,549 B1 | 3/2001 | Rao et al. | |
| 6,624,499 B2 | 9/2003 | Kothandaraman et al. | |
| 6,646,950 B2 | 11/2003 | Akaogi | |
| 6,661,704 B2 | 12/2003 | Eaton, Jr. | |
| 6,785,177 B2 | 8/2004 | Choy et al. | |
| 6,809,961 B2 | 10/2004 | Micheloni et al. | |
| 6,853,586 B2 | 2/2005 | Choy et al. | |
| 2002/0196693 A1 | 12/2002 | Bertin et al. | |
| 2003/0107912 A1 | 6/2003 | Derner et al. | |
| 2004/0218421 A1 | 11/2004 | Choy et al. | |
| 2005/0094472 A1* | 5/2005 | Ishikawa et al. ............. 365/226 |
| 2007/0002610 A1* | 1/2007 | Knall .......................... 365/175 |

FOREIGN PATENT DOCUMENTS

| JP | 03-155652 A | 7/1991 |
|---|---|---|
| JP | 07-272497 A | 10/1995 |
| JP | 2006-286166 A | 10/2006 |

OTHER PUBLICATIONS

PCT Search report and Written Opinion for corresponding PCT Application No. PCT/US08/53131 mailed Jun. 30, 2008.
Metzger; "A 16K CMOS PROM with polysilicon fusible links"; IEEE Journal of Solid-State Circuits, Oct. 1983, vol. 18, Issue 5, on pp. 562-567.
Makwana et al; "A Nonvolatile Memory Overview" http://aplawrence.com/Makwana/nonvolmem.html.
de Graaf et al; "A Novel High-Density Low-Cost Diode Programmable Read Only Memory" Electron Devices Meeting, 1996., International Dec. 8-11, 1996 pp. 189-192.

* cited by examiner

*Primary Examiner*—Son Dinh
(74) *Attorney, Agent, or Firm*—Susan C. Hill

(57) ABSTRACT

The fuse array described herein is very compact and uses little semiconductor area because of its crosspoint architecture. The disclosed crosspoint architecture reduces the number of conductors that must be run horizontally or vertically through each bit cell. As a result, the area required for each bit cell is significantly reduced. In one embodiment, a selected set of voltages on various wordlines and bitlines are used to program the fuses to produce programmed fuses having a tighter distribution of impedances. Similarly, a selected set of voltages on various wordlines and bitlines are used to read the fuses.

20 Claims, 3 Drawing Sheets

INTEGRATED CIRCUIT FUSE ARRAY

CROSS-REFERENCES TO RELATED APPLICATION(S)

This application is related to U.S. patent application Ser. No. 11/487,863, filed on Jul. 17, 2006, entitled "CONCURRENT PROGRAMMING AND PROGRAM VERIFICATION OF FLOATING GATE TRANSISTOR," naming Jon Choy as the first named inventor, and assigned to the current assignee hereof.

This application is related to U.S. patent application Ser. No. 11/681,424, filed concurrently herewith, entitled "INTEGRATED CIRCUIT FUSE ARRAY," naming Alexander Hoefler as the first named inventor, and assigned to the current assignee hereof.

BACKGROUND

1. Field

This disclosure relates generally to integrated circuits, and more specifically, to an integrated circuit fuse array.

2. Related Art

One time programmable memory is very useful on an integrated circuit (IC). One time programmable memory allows an IC to be customized by the buyer of the IC. Buyers of ICs want even more capability to customize the ICs they purchase. As a result, it is desirable to increase the storage capacity of the one time programmable memory on an IC. However, it is also desirable to keep the actual semiconductor area required to implement the one time programmable memory to as small an area as possible. In addition, it is also desirable to improve the procedures and circuitry used to program the one time programmable memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The fuse array described herein is very compact and uses little semiconductor area because of its crosspoint architecture. The disclosed crosspoint architecture reduces the number of conductors that must be run horizontally or vertically through each bit cell. It also reduces the number and complexity of devices in an individual fuse bitcell. As a result, the area required for each bit cell is significantly reduced. In one embodiment, a selected set of voltages on various wordlines and bitlines are used to program the fuses to produce programmed fuses having a tighter distribution of impedances. Similarly, a selected set of voltages on various wordlines and bitlines are used to read the fuses.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
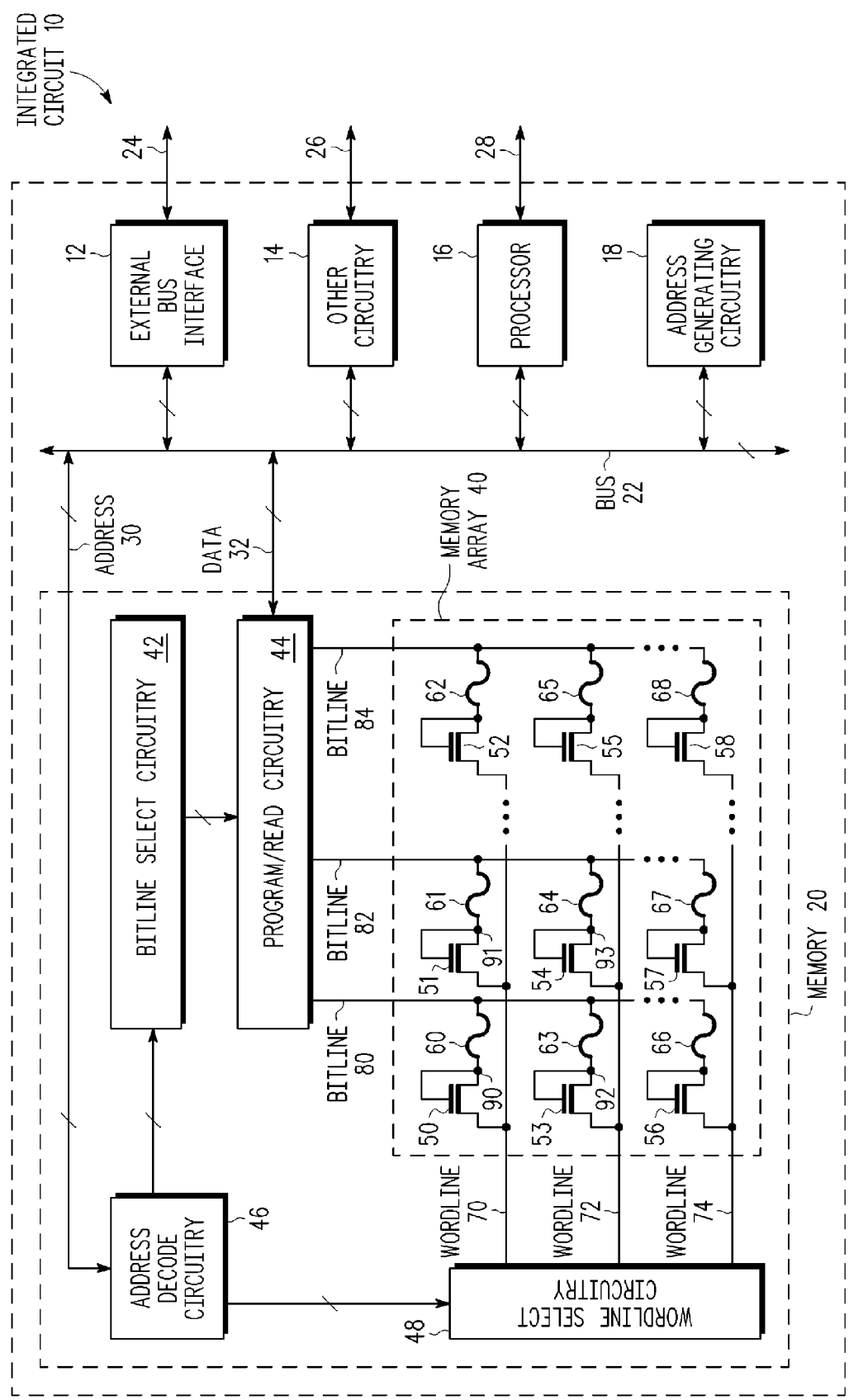
FIG. 1 illustrates, in partial block diagram form and partial schematic diagram form, an integrated circuit in accordance with one embodiment of the present invention.

FIG. 1 illustrates, in partial block diagram form and partial schematic diagram form, an integrated circuit 10 in accordance with one embodiment of the present invention. Memory array 40 comprises a plurality of cells, wherein each cell comprises a transistor 50-58 and an electrically programmable fuse 60-68. The memory cells are arranged in a crosspoint arrangement such that there is no need to run power or ground conductors through the cells. Without the need to include power and/or ground conductors, the layout area of the cell can be significantly reduced. In addition, other than the wordlines and the bitlines, there are no other conductors that must be routed through each cell. For example, there is no need to route a conductor to couple the control electrodes of a plurality of cells together. Note that since fewer conductors are required for the cells in memory array 40, fewer metal layers may be required during manufacturing, and devices of less complexity at the intersection points of the crosspoint array may be required; thus integrated circuit 10 may be cheaper to manufacture.

Note that the transistor and fuse in each cell are coupled in such a way that the transistor becomes less conducting as the fuse becomes less conducting. For discussion purposes, the cell comprising transistor 50 and fuse 60 will be used as an example. At the beginning of the programming process when the fuse 60 is in the low impedance state, the voltage on node 90 is closer to the voltage on bitline 80 than to the voltage on wordline 70. At the end of the programming process, the voltage on node 90 is closer to the voltage on wordline 70 than to the voltage on bitline 80. This provides for a self-limiting programming process. It has been found that reducing the programming current once the impedance of the fuse significantly increases allows more precise control over the final impedance of the fuse at the end of the programming process. It is advantageous to control the impedance of fuses 60-68 in a memory array 40 so that the dispersion of impedance values is narrower. As a result, there is not as much variation in impendance value between each of fuses 60-68, and the electrical behavior of memory array 40 is more deterministic. By connecting the first current electrode of the transistor to the control electrode of that same transistor, the voltage on node 90 acts to reduce the programming current once the impedance of the fuse significantly increases.

Note that the impedance of the transistor 50 between the first current electrode (coupled to node 90) and the second current electrode (coupled to wordline 70) is higher than an impedance of the fuse 60 between the first terminal (coupled to node 90) and the second terminal (coupled to bitline 80). If this was not the case, then transistor 50 would not conduct and would prevent the programming of fuse 60. Note that the total impedance of transistor 50 and fuse 60 combined is low enough to support a sufficiently high programming current flowing between bitline 80 and wordline 70 to program fuse 60 for the illustrated embodiment. The term "impedance" as used herein is being used interchangeable with the term "resistance", although it is acknowledged that in other contexts outside this invention, these terms may be used differently.

In an alternate embodiment, an anti-fuse could be used for fuses 60-68. An anti-fuse is a fuse that goes from a high impedance state to a low impedance state when programmed. If one or more anti-fuses are used, some corresponding changes may be made, such as, for example, a p-channel transistor may be used for transistors 50-58 instead of the illustrated n-channel transistor. Additionally, the voltages applied on the selected and non-selected bitlines and the selected and non-selected wordlines during programming and read operations would need to be adjusted appropriately. Some embodiments may use anti-fuses for only a portion of memory array 40. Alternate embodiments may use a plurality of memory arrays 40, wherein one or more memory arrays use fuses and one or more different memory arrays use anti-fuses. Alternate embodiments may still use n-channel transistors with anti-fuses.

In an alternate embodiment, transistors 50-58 may be replaced by a diode. Note that depending on the orientation of the diode, the voltages applied on the selected and non-selected bitlines and the selected and non-selected wordlines during programming and read operations might need to be adjusted appropriately. Such adjustment is well within the capability of one of average skill in the art based upon the description herein.

In the illustrated embodiment, address generating circuitry 18 may be used to generate an address that is provided to address decode circuitry 46. In alternate embodiments, address generating circuitry 18 may be located any where on integrated circuit 10. For example, address generating circuitry 18 may be located within processor 16, within other circuitry 14, or within external bus interface 12. Address generating circuitry 18 may alternately be part of a DMA (direct memory access) circuit. Alternately, an address may be provided to address decode circuitry 46 from external to the integrated circuit 10. For example, in the illustrated embodiment, an address may be provided to address decode circuitry 46 by way of integrated circuit terminals 24, external bus interface 12, bus 22, and address 30.

Address decode circuitry 46 decodes the address and provides control information to bitline select circuitry 42 and wordline select circuitry 48 based upon the value of the address. Bitline select circuitry 42 uses this control information to determine which one or more bitlines 80, 82, 84 to select. Wordline select circuitry 48 uses this control information to determine which one or more wordlines 70, 72, 74 to select. In the illustrated embodiment, only one bitline 80, 82, 84 and one wordline 70, 72, 74 are selected at a time during fuse programming. Alternate embodiments may select any number of bitlines and any number of wordlines during programming. In the illustrated embodiment, a plurality of bitlines 80, 82, 84 and one wordline 70, 72, 74 are selected at a time during fuse reading. Alternate embodiments may select any number of bitlines and any number of wordlines during reading of memory 20.

The connectivity of FIG. 1 will now be described. FIG. 1 illustrates one embodiment of an integrated circuit 10. In the illustrated embodiment, integrated circuit 10 has a bus 22 which is bi-directionally coupled to external bus interface 12, other circuitry 14, processor 16, address generating circuitry 18, and memory 20 in order to allow communication between these various blocks of circuitry. External bus interface 12 may be coupled to circuitry external to integrated circuit 10 by way of terminals 24 (e.g. pins, bumps, or any type of appropriate conducting apparatus). Other circuitry 14 may be coupled to circuitry external to integrated circuit 10 by way of terminals 26 (e.g. pins, bumps, or any type of appropriate conducting apparatus). Processor 16 may be coupled to circuitry external to integrated circuit 10 by way of terminals 28 (e.g. pins, bumps, or any type of appropriate conducting apparatus). Alternate embodiments may not have one or more of terminals 24, 26, and/or 28. Other circuitry 14 may be any type of circuitry, such as, for example, memory, a timer, communication circuitry, drivers (e.g. liquid crystal display drivers), an analog to digital converter, a digital to analog converter, another processor, or any other desired circuitry for performing any desired function.

In the illustrated embodiment, memory 20 is coupled to bus 22 by way of address conductors or signals 30 and data signals 32. Memory 20 may also receive one or more control signals (e.g. a read/write signal) from bus 22. Such control signals for controlling read and write accesses to a memory are well known in the art. In the illustrated embodiment, address conductors 30 are coupled to address decode circuitry 46. Address decode circuitry 46 decodes the incoming address signals 30 and provides signals to bitline select circuitry in response. In response, bitline select circuitry 42 provides signals to program/read circuitry 44 indicating which bitlines are to be selected for the program or read operation. The program/read circuitry 44 then provides the appropriate voltages on bitlines 80, 82, and 84 to accomplish the desired read or program operation on the selected bitlines. Address decode circuitry 46 also provides signals to wordline select circuitry 48 in response to decoding the incoming address signals 30. In response, wordline select circuitry 48 provides the appropriate voltages on wordlines 70, 72, and 74 to accomplish the desired read or program operation on the selected wordlines.

Memory array 40 is coupled to bitlines 80, 82, and 84, and to wordlines 70, 72, and 74. Memory array 40 comprises a plurality of cells, wherein each cell comprises a transistor 50-58 and an electrically programmable fuse 60-68. In the illustrated embodiment, a first cell comprises an n-channel transistor 50 having a first current electrode coupled to wordline 70, and having a second current electrode and a control electrode coupled to node 90. The first cell also comprises a fuse 60 having a first terminal coupled to node 90 and having a second terminal coupled to bitline 80. Memory array 40 also comprises a second cell. In the illustrated embodiment, the second cell comprises an n-channel transistor 51 having a first current electrode coupled to wordline 70, and having a second current electrode and a control electrode coupled to node 91. The second cell also comprises a fuse 61 having a first terminal coupled to node 91 and having a second terminal coupled to bitline 82. Memory array 40 may have any desired and appropriate number of cells that are coupled to wordline 70. In the illustrated embodiment, memory array 40 also comprises a third cell. In the illustrated embodiment, the third cell comprises an n-channel transistor 52 having a first current electrode coupled to wordline 70, and having a second current electrode and a control electrode coupled to a first terminal of fuse 62. The second terminal of fuse 62 is coupled to bitline 84.

In the illustrated embodiment, a fourth cell comprises an n-channel transistor 53 having a first current electrode coupled to wordline 72, and having a second current electrode and a control electrode coupled to node 92. The fourth cell also comprises a fuse 63 having a first terminal coupled to node 92 and having a second terminal coupled to bitline 80. Memory array 40 also comprises a fifth cell. In the illustrated embodiment, the fifth cell comprises an n-channel transistor 54 having a first current electrode coupled to wordline 72, and having a second current electrode and a control electrode coupled to node 93. The fifth cell also comprises a fuse 64 having a first terminal coupled to node 93 and having a second terminal coupled to bitline 82. Memory array 40 may have any desired and appropriate number of cells that are coupled to wordline 72. In the illustrated embodiment, memory array 40 also comprises a sixth cell. In the illustrated embodiment, the sixth cell comprises an n-channel transistor 55 having a first current electrode coupled to wordline 72, and having a second current electrode and a control electrode coupled to a first terminal of fuse 65. The second terminal of fuse 65 is coupled to bitline 84.

In the illustrated embodiment, a seventh cell comprises an n-channel transistor 56 having a first current electrode coupled to wordline 74, and having a second current electrode and a control electrode coupled to a first terminal of fuse 66. The second terminal of fuse 66 is coupled to bitline 80. Memory array 40 also comprises an eighth cell. In the illustrated embodiment, the eighth cell comprises an n-channel transistor 57 having a first current electrode coupled to wordline 74, and having a second current electrode and a control electrode coupled to a first terminal or fuse 67. The second terminal of fuse 67 is coupled to bitline 82. Memory array 40 may have any desired and appropriate number of cells that are coupled to wordline 74. In the illustrated embodiment, memory array 40 also comprises a ninth cell. In the illustrated embodiment, the ninth cell comprises an n-channel transistor 58 having a first current electrode coupled to wordline 74, and having a second current electrode and a control electrode coupled to a first terminal of fuse 68. The second terminal of fuse 68 is coupled to bitline 84. Alternate embodiments may use any desired and appropriate architecture for memory 20. The memory 20 illustrated in FIG. 1 is just one possible example.

Figure 2:
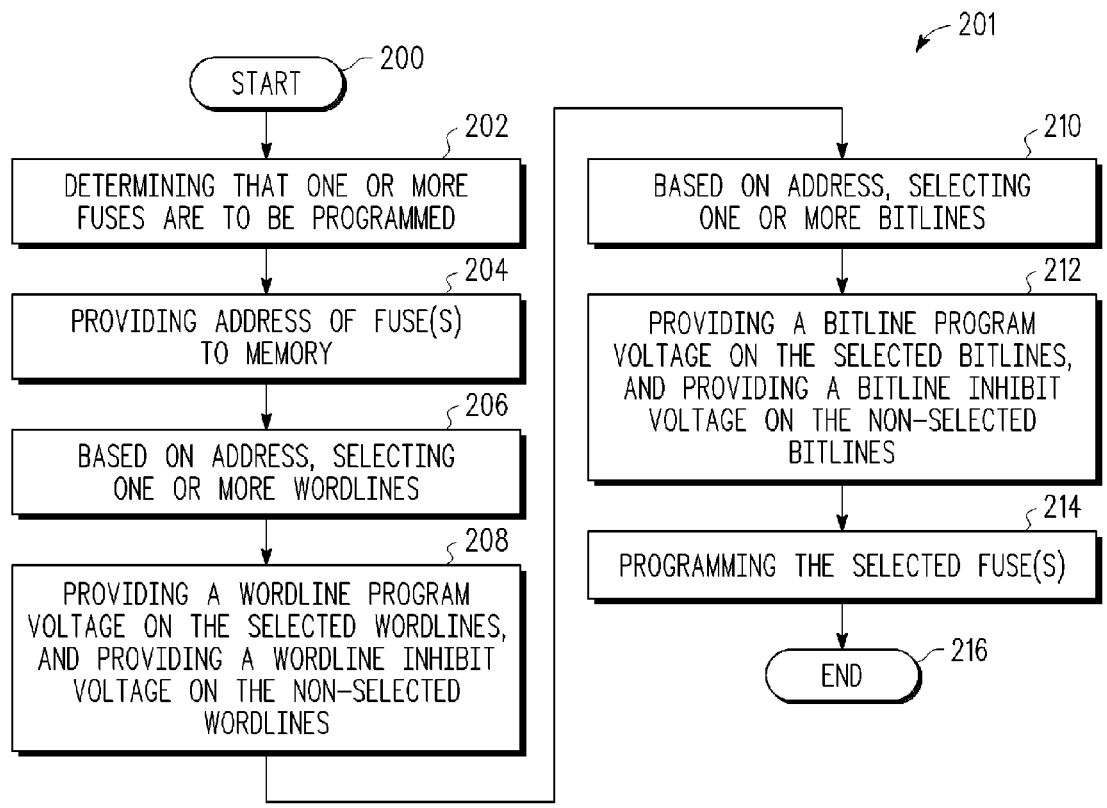
FIG. 2 illustrates, in flow diagram form, a method for programming one or more fuses in accordance with one embodiment of the present invention.

FIG. 2 illustrates, in flow diagram form, a method for programming one or more fuses (e.g. fuses 60-68 of FIG. 1) in accordance with one embodiment of the present invention. The flow 201 starts at start oval 200. The flow 201 proceeds to step 202 where it is determined that one or more fuses are to be programmed. Referring to FIG. 1, any appropriate portion of circuitry on integrated circuit 10 may perform this determining step. Alternately, something external to integrated circuit 10, e.g. a computer (not shown), may perform this determining step.

From step 202, the flow 201 proceeds to step 204 where the address of the one or more fuses to be programmed are provided. In alternate embodiments, the address may comprise a single address, a range of contiguous addresses, or a plurality of non-contiguous addresses or address ranges.

From step 204, the flow 201 proceeds to step 206 where one or more wordlines (e.g. wordlines 70, 72, 74 of FIG. 1) are selected. Referring to FIG. 1, the wordline select circuitry 48 may perform this function in the illustrated embodiment. In alternate embodiments, this function may be performed in a different manner by different circuitry.

From step 206, the flow 201 proceeds to step 208 where a wordline program voltage is provided on the selected wordlines, and a wordline inhibit voltage is provided on the non-selected wordlines. In one embodiment of the invention, the wordline program voltage provided on the selected wordlines is approximately equal to the first power supply voltage (VSS), which is approximately ground or 0 volts for the illustrated embodiment. Alternate embodiments may use a different voltage for the first power supply voltage. Alternate embodiments may use a different voltage for the wordline program voltage. In one embodiment of the invention, the wordline inhibit voltage provided on the non-selected wordlines is approximately equal to the second power supply voltage (VDD), which is approximately 1.2 volts for the illustrated embodiment. Alternate embodiments may use a different voltage for the second power supply voltage. Alternate embodiment may use a different voltage for the wordline inhibit voltage.

From step 208, the flow 201 proceeds to step 210 where one or more bitlines (e.g. bitlines 80, 82, 84 of FIG. 1) are selected. Referring to FIG. 1, the bitline select circuitry 42 may perform this function in the illustrated embodiment. In alternate embodiments, this function may be performed in a different manner by different circuitry.

From step 210, the flow 201 proceeds to step 212 where a bitline program voltage is provided on the selected bitlines, and a bitline inhibit voltage is provided on the non-selected bitlines. In one embodiment of the invention, the bitline program voltage provided on the selected bitlines is approximately equal to twice the second power supply voltage (twice VDD), which is approximately 2.4 volts for the illustrated embodiment. Alternate embodiments may use a different voltage for the second power supply voltage. Alternate embodiments may use a different voltage for the bitline program voltage. For example, in one embodiment of the invention, a voltage of 3.0 volts may be used for the bitline program voltage. Alternate embodiments may use a bitline program voltage in the range of 1.5 times the second power supply voltage to 3 times the second power supply voltage. In one embodiment of the invention, the bitline inhibit voltage provided on the non-selected bitlines is approximately equal to the first power supply voltage (VSS), which is approximately 0 volts for the illustrated embodiment. Alternate embodiments may use a different voltage for the first power supply voltage. Alternate embodiment may use a different voltage for the bitline inhibit voltage.

From step 212, the flow 201 proceeds to step 214 where the one or more fuses (e.g. one or more of fuses 60-68 of FIG. 1) coupled to a selected wordline and a selected bitline are programmed. Referring to FIG. 1, the bitline select circuitry 42 in combination with the programming circuitry portion of the program/read circuitry 44 may be used to provide the appropriate voltages on the selected and non-selected bitlines. The wordline select circuitry 48 may be used to provide the appropriate voltages on the selected and non-selected wordlines. In alternate embodiments, the function of providing the appropriate voltages to the bitlines and wordlines may be performed in a different manner by different circuitry than that illustrated in FIG. 1. The circuitry illustrated in FIG. 1 is intended only as one possible embodiment of circuitry to implement the method of FIG. 2. Many other circuits may be used to implement the method of FIG. 2. From step 214, the flow proceeds to end oval 216 where the flow ends. Alternate embodiment of flow 201 may use fewer, more, or different steps than those illustrated in FIG. 2.

Figure 3:
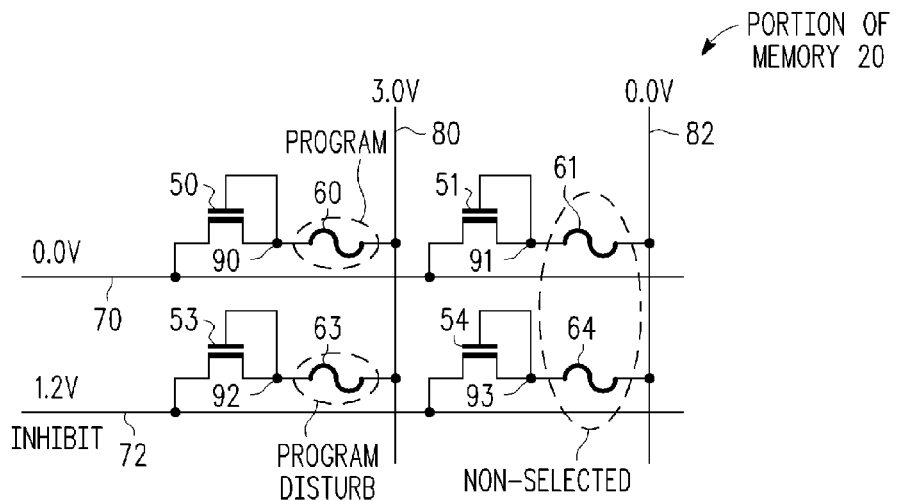
FIG. 3 illustrates, in schematic diagram form, a portion of memory 20 in accordance with one embodiment of the present invention.

FIG. 3 illustrates, in schematic diagram form, a portion of memory 20 in accordance with one embodiment of the present invention. The purpose of FIG. 3 is to illustrate one possible manner in which the fuses 60-68 in memory 20 (see FIG. 1) may be programmed. Alternate embodiments may use a different method. In the illustrated embodiment, it has been determined that fuse 60 is to be programmed. In order to program fuse 60, one bit line (bitline 80) and one wordline (wordline 70) are selected. These are the bitline and wordline that are coupled to fuse 60 and transistor 50, respectively. A voltage approximately equal to the first power supply voltage (approximately ground or VSS in one embodiment) is provided to the selected wordline 70. A voltage approximately equal to the second power supply voltage (approximately VDD in one embodiment) is provided to the remaining wordlines (e.g. 72) which are all non-selected wordlines in this embodiment. Note that alternate embodiments may choose to select more than one wordline at a time during programming. A voltage approximately equal to twice the second power supply voltage (approximately twice VDD in one embodiment) is provided to the selected bitline 80. A voltage approximately equal to the first power supply voltage (approximately ground in one embodiment) is provided to the remaining bitlines (e.g. 82) which are all non-selected bitlines in this embodiment. Note that alternate embodiments may choose to select more than one bitline at a time during programming. Some embodiment may select one bitline and a plurality of wordlines, and other embodiments may select one wordline and a plurality of bitlines. Yet other embodiments may select a subset of the bitlines and a subset of the wordlines.

Note that providing approximately twice VDD to the bitline 80 while providing approximately ground to the wordline 70 produces a large voltage drop between the bitline 80 and the wordline 70. As a result, a large current flows through fuse 60 and transistor 50. Because the control electrode of transistor 50 is coupled to node 90, transistor 50 is conducting once the selected programming voltages are provided on bitline 80 and wordline 70. As a result, the voltage of node 90 is closer to the voltage of wordline 70 than to the voltage of bitline 80. As a result of the large current flow, fuse 60 is programmed. Once programmed, the impedance of fuse 60 significantly increases from that of its unprogrammed state. Once the impedance of fuse 60 increases significantly, the voltage on node 90 decreases to be closer to the voltage on wordline 70 than to the voltage on bitline 80. Note that when the voltage on node 90 decreases, the transistor 50 transitions to a non-conducting state. When transistor 50 transitions to the non-conducting state, the current through fuse 60 is reduced and stopped, and the programming of fuse 60 is complete.

The behavior of non-selected cells will now be described. Note that there are several variations of non-selected cells to be described. There are cells for which both the bitline and wordline are non-selected (e.g. cell 54, 64), cells for which the bitline is selected and the wordline in non-selected (e.g. 53, 63), and cells for which the bitline is non-selected and the wordline is selected (e.g. cell 51, 61).

The behavior of the cell comprising transistor 51 and fuse 61 will be described first. Since the bitline 82 and the wordline 70 are both at approximately ground, there is no current through transistor 51 and fuse 61. Fuse 61 is thus not programmed and not affected. Also, the voltage of node 91 is at approximately ground.

The behavior of the cell comprising transistor 54 and fuse 64 will be described next. Since the bitline 82 is at approximately ground and the wordline 72 is at approximately VDD, there is a very small current through transistor 54 and fuse 64. However, this very small current is not nearly enough to program or even significantly impact fuse 64. Fuse 64 is thus not programmed and not significantly affected. Also, the voltage of node 93 is at approximately ground.

The behavior of the cell comprising transistor 53 and fuse 63 will be described next. Since the bitline 80 is at approximately twice VDD and the wordline 72 is at approximately VDD, there is a small current through transistor 53 and fuse 63. However, this small current is not enough to program or even significantly impact fuse 63. Fuse 63 is thus not programmed and not significantly affected. Also, the voltage of node 92 is slightly higher than VDD. As a result, transistor 53 is slightly turned on and is slightly conducting. Consequently, a small current flows from bitline 80 to wordline 72.

Figure 4:
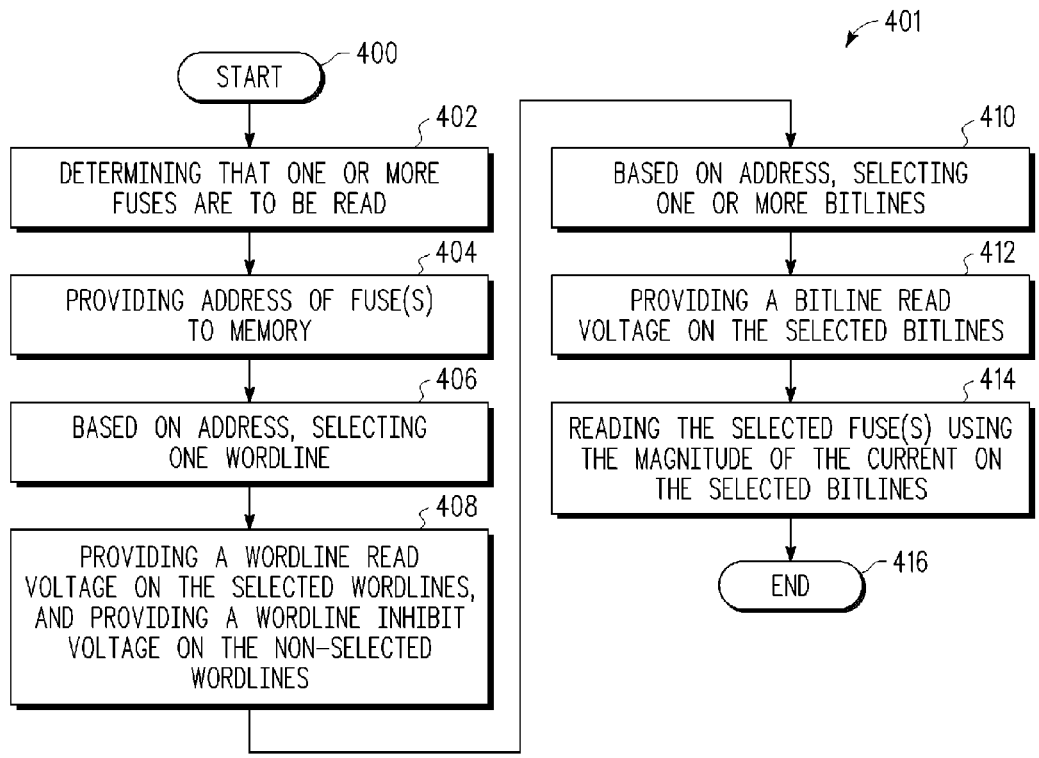
FIG. 4 illustrates, in flow diagram form, a method for reading one or more fuses in accordance with one embodiment of the present invention.

FIG. 4 illustrates, in flow diagram form, a method for reading one or more fuses (e.g. fuses 60-68 of FIG. 1) in accordance with one embodiment of the present invention. The flow 401 starts at start oval 400. The flow 401 proceeds to step 402 where it is determined that one or more fuses are to be read. Referring to FIG. 1, any appropriate portion of circuitry on integrated circuit 10 may perform this determining step. Alternately, something external to integrated circuit 10, e.g. a computer (not shown), may perform this determining step.

From step 402, the flow 401 proceeds to step 404 where the address of the one or more fuses to be read are provided. In alternate embodiments, the address may comprise a single address, a range of contiguous addresses, or a plurality of non-contiguous addresses or address ranges.

From step 404, the flow 401 proceeds to step 406 where one or more wordlines (e.g. wordlines 70, 72, 74 of FIG. 1) are selected. Referring to FIG. 1, the wordline select circuitry 48 may perform this function in the illustrated embodiment. In alternate embodiments, this function may be performed in a different manner by different circuitry.

From step 406, the flow 401 proceeds to step 408 where a wordline read voltage is provided on the selected wordlines, and a wordline inhibit voltage is provided on the non-selected wordlines. Note that the wordline inhibit voltage used for a read operation (see FIGS. 4 and 5) may be totally unrelated to the wordline inhibit voltage used for a program operation (see FIGS. 2 and 3). The wordline inhibit voltage described in FIG. 2 refers to a wordline program inhibit voltage, and the wordline inhibit voltage described in FIG. 4 refers to a wordline read inhibit voltage. Referring again to FIG. 4, in one embodiment of the invention, the wordline read voltage provided on the selected wordlines is approximately equal to the first power supply voltage (VSS), which is approximately ground or 0 volts for the illustrated embodiment. Alternate embodiments may use a different voltage for the first power supply voltage. Alternate embodiments may use a different voltage for the wordline read voltage. In one embodiment of the invention, the wordline inhibit voltage provided on the non-selected wordlines is approximately equal to the second power supply voltage (VDD), which is approximately 1.2 volts for the illustrated embodiment. Alternate embodiments may use a different voltage for the second power supply voltage. Alternate embodiment may use a different voltage for the wordline inhibit voltage.

From step 408, the flow 401 proceeds to step 410 where one or more bitlines (e.g. bitlines 80, 82, 84 of FIG. 1) are selected. Referring to FIG. 1, the bitline select circuitry 42 may perform this function in the illustrated embodiment. In alternate embodiments, this function may be performed in a different manner by different circuitry.

From step 410, the flow 401 proceeds to step 412 where a bitline read voltage is provided on the selected bitlines. In one embodiment of the invention, the bitline read voltage provided on the selected bitlines is approximately equal to the second power supply voltage (VDD), which is approximately 1.2 volts for the illustrated embodiment. Alternate embodiments may use a different voltage for the second power supply voltage. Alternate embodiments may use a different voltage for the bitline read voltage. As their associated cells or fuses are not being read, any non-selected bitlines may be driven to any appropriate voltage (e.g. the second power supply voltage VDD). Alternate embodiments may use a different voltage for the second power supply voltage. Alternate embodiments may use a different voltage for the non-selected bitlines.

From step 412, the flow 401 proceeds to step 414 where the one or more fuses (e.g. one or more of fuses 60-68 of FIG. 1) coupled to a selected wordline and a selected bitline are read. In one embodiment, the magnitude of the current on the selected bitlines is used to perform the reading. In alternate embodiments, the state of one or more fuses 60-68 may be sensed or read in a different manner. Referring to the embodiment illustrated in FIG. 1, the bitline select circuitry 42 in combination with the programming circuitry portion of the program/read circuitry 44 may be used to provide the appropriate voltages on the selected and non-selected bitlines. The wordline select circuitry 48 may be used to provide the appropriate voltages on the selected and non-selected wordlines. In alternate embodiments, the function of providing the appropriate voltages to the bitlines and wordlines may be performed in a different manner by different circuitry than that illustrated in FIG. 1. The circuitry illustrated in FIG. 1 is intended only as one possible embodiment of circuitry to implement the method of FIG. 4. Many other circuits may be used to implement the method of FIG. 4. From step 414, the flow proceeds to end oval 416 where the flow ends. Alternate embodiment of flow 401 may use fewer, more, or different steps than those illustrated in FIG. 4.

Figure 5:
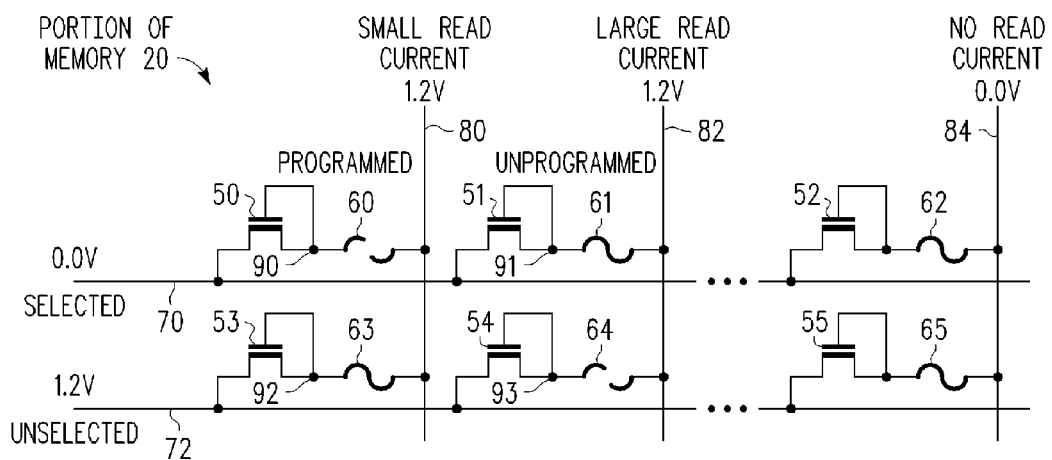
FIG. 5 illustrates, in schematic diagram form, a portion of memory 20 in accordance with one embodiment of the present invention.

FIG. 5 illustrates, in schematic diagram form, a portion of memory 20 in accordance with one embodiment of the present invention. The purpose of FIG. 5 is to illustrate one possible manner in which the fuses 60-68 in memory 20 (see FIG. 1) may be read. Alternate embodiments may use a different method. In the illustrated embodiment, it has been determined that fuses 60 and 61 are to be read. Note that in the illustrated embodiment, fuses 60 and 64 have been programmed and fuses 61 and 63 have not been programmed. In order to read fuses 60 and 61, two bit line (bitlines 80 and 82) and one wordline (wordline 70) are selected. These are the bitlines and wordline that are coupled to fuses 60 and 61 and transistors 50 and 51. A voltage approximately equal to the first power supply voltage (approximately ground or VSS in one embodiment) is provided to the selected wordline 70. A voltage approximately equal to the second power supply voltage (approximately VDD in one embodiment) is provided to the remaining wordlines (e.g. 72) which are all non-selected wordlines in this embodiment. Note that alternate embodiments may choose to select more than one wordline at a time during a read access. A voltage approximately equal to the second power supply voltage (approximately VDD in one embodiment) is provided to the selected bitlines 80 and 82. As their associated cells are not being read, any non-selected bitlines may be driven to any appropriate voltage (e.g. ground). For example, in one embodiment, the non-selected bitlines may be driven to approximately the first power supply voltage (approximately ground in one embodiment). Alternate embodiments may use a different voltage on the non-selected bitlines (e.g. bitline 84 in FIG. 1). Note that alternate embodiments may choose to select any number of bitlines at a time during programming. Some embodiments may select one bitline and a plurality of wordlines, and other embodiments may select one wordline and a plurality of bitlines. Yet other embodiments may select a subset of the bitlines and a subset of the wordlines.

The read of a programmed fuse will now be described. In the illustrated embodiment, fuse 60 has been programmed. Providing approximately VDD to the bitline 80 while providing approximately ground to the wordline 70 produces a voltage drop between the bitline 80 and the wordline 70. However, since fuse 60 has been programmed and is in a high impedance state, only a small current is conducted through fuse 60. As a result, node 90 is closer to the voltage of wordline 70 than to the voltage of bitline 80. Consequently, transistor 50 is non-conducting. Thus, only a small current is provided to bitline 80 from wordline 70 via transistor 50 and fuse 60. This small read current on bitline 80 may be sensed by sensing circuitry in program/read circuitry 44 as the logic state of a programmed fuse (e.g. fuse 60). In one embodiment, this sensing circuitry may be a standard sense amplifier. Alternate embodiments may use any desired circuitry to sense the logic state of the fuses in memory 20.

The read of unprogrammed fuse will now be described. In the illustrated embodiment, fuse 61 is unprogrammed. Providing approximately VDD to the bitline 82 while providing approximately ground to the wordline 70 produces a voltage drop between the bitline 82 and the wordline 70. However, since fuse 61 has not been programmed and is in a low impedance state, a larger current is conducted through fuse 61. As a result, node 91 is closer to the voltage of bitline 82 than to the voltage of wordline 70. Consequently, transistor 51 is slightly conducting. Thus, a larger current is provided to bitline 82 from wordline 70 via transistor 51 and fuse 61. This larger read current on bitline 82 may be sensed by sensing circuitry in program/read circuitry 44 as the logic state of an unprogrammed fuse (e.g. fuse 61). In one embodiment, this sensing circuitry may be a standard sense amplifier. Alternate embodiments may use any desired circuitry to sense the logic state of the fuses in memory 20.

The affect of a read on non-selected fuses, both programmed (e.g. 64) and unprogrammed (e.g. 63) will now be described. In the illustrated embodiment, fuse 63 is unprogrammed. Providing approximately VDD to the bitline 80 while providing approximately VDD to the wordline 70 produces no voltage drop between the bitline 80 and the wordline 70. As a result, no current is conducted through transistor 53 and fuse 63. Consequently fuse 63 has no impact on the current provided on bitline 80. Thus, fuse 63 does not impact the reading of fuse 60 which is coupled to the same bitline 80. In the illustrated embodiment, fuse 64 is programmed. Providing approximately VDD to the bitline 82 while providing approximately VDD to the wordline 70 produces no voltage drop between the bitline 82 and the wordline 70. As a result, no current is conducted through transistor 54 and fuse 64. Consequently fuse 64 has no impact on the current provided on bitline 82. Thus, fuse 64 does not impact the reading of fuse 61 which is coupled to the same bitline 82.

Note that alternate embodiments may shift the voltages used for programming and reading. For example, referring to FIGS. 3 and 5, memory 20 may use 4.0 volts instead of 3.0 volts, may use 2.2 volts instead of 1.2 volts, and may use 1.0 volts instead of 0 volts. Similarly, an alternate embodiment of memory 20 may use 1.8 volts instead of 3.0 volts, may use 0 volts instead of 1.2 volts, and may use −1.2 volts instead of 0 volts. Other embodiments may use any value of offset voltage. As dimensions used on integrated circuits are reduced, alternate embodiments may use voltages with the same relationships (which voltages are greater and which voltages are smaller), however the absolute values of the voltages may change by different amounts. For example, referring to FIGS. 3 and 5, memory 20 may use 2.0 volts instead of 3.0 volts, may use 0.8 volts instead of 1.2 volts, and may remain using 0 volts. Other embodiments may use any appropriate value for scaling the program and/or read voltages.

The affect of a read on non-selected fuses coupled to non-selected bitlines, e.g. 65 and 62, and both coupled to a selected wordline and coupled to a non-selected wordline will now be described. For situations in which the non-selected fuses are coupled to non-selected bitlines and are coupled to non-selected wordlines, the voltage applied to the non-selected bitlines may be approximately equal to the second power supply voltage (e.g. ground for one embodiment). Likewise, for situations in which the non-selected fuses are coupled to non-selected bitlines and are coupled to selected wordlines and are unprogrammed, the voltage applied to the non-selected bitlines may be approximately equal to the second power supply voltage (e.g. ground for one embodiment). For situations in which the non-selected fuses are coupled to non-selected bitlines and are coupled to selected wordlines and are unprogrammed, the voltage applied to the non-selected bitlines may be approximately equal to the second power supply voltage (e.g. ground for one embodiment). However, note that for this situation, transistor 55 may be used to block any current from flowing through fuse 65. Current flowing through fuse 65 in this situation would increase the power consumption of memory 20, which is undesirable.

In the illustrated embodiment, fuse 63 is unprogrammed. Providing approximately VDD to the bitline 80 while providing approximately VDD to the wordline 72 produces no voltage drop between the bitline 80 and the wordline 72. As a result, no current is conducted through transistor 53 and fuse 63. Consequently fuse 63 has no impact on the current provided on bitline 80. Thus, fuse 63 does not impact the reading of fuse 60 which is coupled to the same bitline 80. In the illustrated embodiment, fuse 64 is programmed. Providing approximately VDD to the bitline 82 while providing approximately VDD to the wordline 72 produces no voltage drop between the bitline 82 and the wordline 72. As a result, no current is conducted through transistor 54 and fuse 64. Consequently fuse 64 has no impact on the current provided on bitline 82. Thus, fuse 64 does not impact the reading of fuse 61 which is coupled to the same bitline 82.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. For example, although transistors 50-58 in FIG. 1 are illustrated as n-channel transistors, alternate embodiments of memory 20 may use p-channel transistors. The voltages applied on the selected and non-selected bitlines and the selected and non-selected wordlines during programming and read operations would need to be adjusted appropriately. Such adjustment is well within the capability of one of average skill in the art based upon the description herein. For example, an alternate embodiment using p-channel transistors in place of transistors 50-58 may merely change the sign of the voltages. For example, referring to FIGS. 3 and 5, memory 20 may use −3.0 volts instead of 3.0 volts, may use −1.2 volts instead of 1.2 volts, and may remain using 0 volts for 0 volts. However, note that a p-channel transistor in some embodiments may not be able to provide as much current to program the fuse as would be available if an n-channel transistor was used.

In addition, alternate embodiments using p-channel transistors in place of transistors 50-58 may shift the voltages used for programming and reading. For example, referring to FIGS. 3 and 5, memory 20 may use −4.0 volts instead of −3.0 volts, may use −2.2 volts instead of −1.2 volts, and may use −1.0 volts instead of 0 volts. Similarly, an alternate embodiment of memory 20 may use −1.8 volts instead of −3.0 volts, may use 0 volts instead of −1.2 volts, and may use 1.2 volts instead of 0 volts. Other embodiments may use any value of offset voltage. As dimensions used on integrated circuits are reduced, alternate embodiments may use voltages with the same relationships (which voltages are greater and which voltages are less), however the absolute values of the voltages may change by different amounts. For example, referring to FIGS. 3 and 5, memory 20 may use −2.0 volts instead of −3.0 volts, may use −0.8 volts instead of −1.2 volts, and may remain using 0 volts for 0 volts. Other embodiments may use any appropriate value for scaling the program and/or read voltages. Note that if negative voltages are not desired, the programming and read voltages may be shifted in a positive direction by an offset so that all voltages become positive or at least zero (ground). Thus, circuits using p-channel transistors in place of transistors 50-58 may be coupled in the same manner as in FIGS. 1, 3, and 5 with the voltages applied as described above for programming and reading.

In addition, the body of devices 50-58 may be grounded (i.e. coupled to a power supply voltage at approximately ground potential) if a bulk semiconductor material is used for forming integrated circuit 10. However, if an SOI (semiconductor on insulator) wafer is used for forming integrated circuit 10, the body of transistors 50-58 may or may not be grounded, but rather floating.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 20 may be located on a same integrated circuit as processor 16 or on a separate integrated circuit or located within another peripheral or slave discretely separate from other elements of system 10. Other circuitry 14 may also be located on separate integrated circuits or devices. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processor (e.g. 16), associated memory (e.g. 20) and a number of input/output (I/O) devices (e.g. 14).

Although the invention is described herein with reference to specific embodiments, various modifications and changes can be made without departing from the scope of the present invention as set forth in the claims below. For example, memory 20 may comprise any number of memory arrays 40. Similarly, IC 10 may comprise any number of memories 20. In addition, other circuitry 14 may comprise other types of memory that do not use fuses. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A method for programming a first fuse, the method comprising:
    providing a plurality of fuses arranged in an array, the array comprising a plurality of fuse wordlines and bitlines, wherein the plurality of fuses comprise the first fuse;
    providing a first voltage to a selected wordline;
    providing a second voltage to a non-selected wordline, wherein a magnitude of the second voltage is greater than a magnitude of the first voltage; and
    providing a third voltage to a selected bitline, wherein a magnitude of the third voltage is greater than the magnitude of the second voltage; and
    wherein the first fuse is programmed in response to the steps of providing the first, second, and third voltages.
2. A method as in item 1, wherein the first fuse is electrically programmable.
3. A method as in item 1, wherein a second fuse is coupled to the selected bitline and the non-selected wordline, and wherein the second fuse remains unprogrammed in response to the steps of providing the second and third voltages.
4. A method as in item 3, further comprising:
    providing a fourth voltage to a non-selected bitline, wherein a magnitude of the fourth voltage is approximately equal to the magnitude of the first voltage.
5. A method as in item 4, wherein a third fuse is coupled to the non-selected bitline and the non-selected wordline, and wherein the third fuse remains unprogrammed in response to the steps of providing the second and fourth voltages.
6. A method as in item 5, wherein a fourth fuse is coupled to the non-selected bitline and the selected wordline, and wherein the fourth fuse remains unprogrammed in response to the steps of providing the first and fourth voltages.
7. A method as in item 1, wherein the first voltage is approximately equal to a first power supply voltage, the second voltage is approximately equal to a second power supply voltage.
8. A method as in item 7, wherein the magnitude of the third voltage is greater than twice a magnitude of the second power supply voltage.
9. A method as in item 1, wherein a transistor coupled to the selected bitline and the non-selected wordline is back biased in response to the steps of providing the first, second, and third voltages.
10. A method for reading a first fuse, the method comprising:
    providing a plurality of fuses arranged in an array, the array comprising a plurality of fuse wordlines and bitlines, wherein the plurality of fuses comprise the first fuse;
    providing a first voltage to a selected wordline;
    providing a second voltage to a non-selected wordline, wherein a magnitude of the second voltage is greater than a magnitude of the first voltage; and
    providing a third voltage to a selected bitline, wherein a magnitude of the third voltage is approximately equal to the magnitude of the second voltage; and
    reading the first fuse in response to the steps of providing the first, second, and third voltages.
11. A method as in item 10, wherein the first fuse is electrically programmable.
12. A method as in item 10, wherein the step of reading comprises comparing a current on the selected bitline and a plurality of currents on a plurality of non-selected bitlines.
13. A method as in item 10, wherein a second fuse is coupled to the selected bitline and the non-selected wordline, and wherein the second fuse remains unread in response to the steps of providing the second and third voltages.

14. A method as in item 13, wherein reading the first fuse does not program the second fuse.

15. A method as in item 13, further comprising:
providing a fourth voltage to a non-selected bitline, wherein a magnitude of the fourth voltage is approximately equal to the magnitude of the first voltage.

16. A method as in item 15, wherein a third fuse is coupled to the non-selected bitline and the non-selected wordline, and wherein the third fuse remains unread in response to the steps of providing the second and fourth voltages.

17. A method as in item 16, wherein a fourth fuse is coupled to the non-selected bitline and the selected wordline, and wherein the fourth fuse remains unread in response to the steps of providing the first and fourth voltages.

18. A method as in item 17, wherein reading the first fuse does not program the second, third, and fourth fuses.

19. A method for accessing a first fuse, the method comprising:
providing a plurality of fuses arranged in an array, the array comprising a plurality of fuse wordlines and bitlines, wherein the plurality of fuses comprise the first fuse;
providing a first voltage to a selected wordline;
providing a second voltage to a non-selected wordline, wherein a magnitude of the second voltage is greater than a magnitude of the first voltage; and
providing a third voltage to a selected bitline, wherein a magnitude of the third voltage is greater than or approximately equal to the magnitude of the second voltage.

20. A method as in item 19, further comprising:
providing an address corresponding to the first fuse;
using the address to select the selected wordline; and
using the address to select the selected bitline.

Additional Text II

1. An integrated circuit, comprising:
a plurality of bitlines;
a plurality of wordlines; and
a plurality of memory cells, each memory cell comprising a fuse having a first terminal and a second terminal, and a transistor having a control electrode, a first current electrode, and a second current electrode,
wherein the control electrode of the transistor is coupled to the first current electrode of said transistor and to the first terminal of the fuse,
wherein the second terminal of the fuse is coupled to one of the plurality of bitlines, and
wherein the second current electrode of the transistor is coupled to one of the plurality of wordlines.

2. An integrated circuit as in item 1, wherein an impedance of the transistor between the first current electrode and the second current electrode is higher than an impedance of the fuse before programming between the first terminal and the second terminal.

3. An integrated circuit as in item 1, wherein the transistor comprises an n-channel transistor.

4. An integrated circuit as in item 1, further comprising:
program circuitry for selectively providing a first voltage to at least one selected wordline from among the plurality of wordlines, for providing a second voltage to all non-selected wordlines from among the plurality of wordlines, for providing a third voltage to at least one selected bitline from among the plurality of bitlines, and for providing a fourth voltage to all non-selected bitlines from among the plurality of bitlines.

5. An integrated circuit as in item 1, further comprising:
program circuitry for selectively providing a first voltage to at least one selected wordline from among the plurality of wordlines, for providing a second voltage to at least one non-selected wordline from among the plurality of wordlines, for providing a third voltage to at least one selected bitline from among the plurality of bitlines, and for providing a fourth voltage to at least one non-selected bitline from among the plurality of bitlines.

6. An integrated circuit as in item 5, wherein the third voltage is a highest voltage, the second voltage is an intermediate voltage, and the first voltage and the fourth voltage are lower than the intermediate voltage.

7. An integrated circuit as in item 5, wherein the first voltage is approximately equal to a first power supply voltage, the second voltage is approximately equal to a second power supply voltage, the third voltage is greater than the second power supply voltage, and the fourth voltage is approximately equal to the first power supply voltage 8. An integrated circuit as in item 7, wherein the third voltage is greater than twice the second power supply voltage 9. An integrated circuit as in item 1, further comprising:
address decode circuitry for decoding a fuse address and for providing a decoded fuse address;
bitline select circuitry for receiving at least a first portion of the decoded fuse address and for selecting at least one bitline in response; and
wordline select circuitry for receiving at least a second portion of the decoded fuse address and for selecting at least one wordline in response.

10. An integrated circuit as in item 9, wherein the bitline select circuitry selects a plurality of bitlines in response to receiving the at least the first portion of the decoded fuse address.

11. An integrated circuit as in item 9, wherein the wordline select circuitry selects a plurality of wordlines in response to receiving the at least the second portion of the decoded fuse address.

12. An integrated circuit as in item 1, further comprising:
address generating circuitry for providing an address of the fuse.

13. An integrated circuit as in item 1, wherein the fuse comprises an electrically programmable fuse.

14. An integrated circuit as in item 1, wherein the fuse comprises an anti-fuse.

15. An integrated circuit as in item 1, wherein the fuse comprises polysilicon.

16. An integrated circuit as in item 1, wherein the fuse comprises a metal.

17. An integrated circuit as in item 1, wherein the fuse comprises silicided polysilicon.

18. A method for providing a memory, the method comprising:
providing a plurality of bitlines;
providing a plurality of wordlines; and
providing a plurality of memory cells, each memory cell comprising a fuse having a first terminal and a second terminal, and a transistor having a control electrode, a first current electrode, and a second current electrode,
wherein the control electrode of the transistor is coupled to the first current electrode of said transistor and to the first terminal of the fuse,
wherein the second terminal of the fuse is coupled to one of the plurality of bitlines,
wherein the second current electrode of the transistor is coupled to one of the plurality of wordlines, and wherein a total impedance of the transistor and the fuse combined is low enough to allow a current flowing between the one of the plurality of bitlines and the one of the plurality of wordlines to program the fuse.

19. An integrated circuit, comprising:
a plurality of fuses;
fuse program circuitry for programming the plurality of fuses;
a plurality of bitlines, coupled to the fuse program circuitry;
a plurality of wordlines; and
a plurality of memory cells coupled to the plurality of bitlines and to the plurality of wordlines, each memory cell comprising one of the plurality of fuses, each one of the plurality of fuses having a first fuse terminal and a second fuse terminal, each memory cell also comprising a device having a first terminal and having a second terminal,
wherein the first fuse terminal is coupled to the first terminal of the device,
wherein the second fuse terminal is coupled to one of the plurality of bitlines, and
wherein the second terminal of the device is coupled to one of the plurality of wordlines.

20. An integrated circuit as in item 19, wherein the plurality of fuses comprise an electrically programmable fuse.

The invention claimed is:

1. A method for programming a first fuse, the method comprising:
providing a plurality of fuses arranged in an array, the array comprising a plurality of fuse wordlines and bitlines, wherein the plurality of fuses comprise the first fuse;
providing a first voltage to a selected wordline;
providing a second voltage to a non-selected wordline, wherein a magnitude of the second voltage is greater than a magnitude of the first voltage; and
providing a third voltage to a selected bitline, wherein a magnitude of the third voltage is greater than the magnitude of the second voltage; and
wherein the first fuse is programmed in response to the steps of providing the first, second, and third voltages.

2. A method as in claim 1, wherein the first fuse is electrically programmable.

3. A method as in claim 1, wherein a second fuse is coupled to the selected bitline and the non-selected wordline, and wherein the second fuse remains unprogrammed in response to the steps of providing the second and third voltages.

4. A method as in claim 3, further comprising:
providing a fourth voltage to a non-selected bitline, wherein a magnitude of the fourth voltage is approximately equal to the magnitude of the first voltage.

5. A method as in claim 4, wherein a third fuse is coupled to the non-selected bitline and the non-selected wordline, and wherein the third fuse remains unprogrammed in response to the steps of providing the second and fourth voltages.

6. A method as in claim 5, wherein a fourth fuse is coupled to the non-selected bitline and the selected wordline, and wherein the fourth fuse remains unprogrammed in response to the steps of providing the first and fourth voltages.

7. A method as in claim 1, wherein the first voltage is approximately equal to a first power supply voltage, the second voltage is approximately equal to a second power supply voltage.

8. A method as in claim 7, wherein the magnitude of the third voltage is greater than twice a magnitude of the second power supply voltage.

9. A method as in claim 1, wherein a transistor coupled to the selected bitline and the non-selected wordline is back biased in response to the steps of providing the first, second, and third voltages.

10. A method for reading a first fuse, the method comprising:
providing a plurality of fuses arranged in an array, the array comprising a plurality of fuse wordlines and bitlines, wherein the plurality of fuses comprise the first fuse;
providing a first voltage to a selected wordline;
providing a second voltage to a non-selected wordline, wherein a magnitude of the second voltage is greater than a magnitude of the first voltage; and
providing a third voltage to a selected bitline, wherein a magnitude of the third voltage is approximately equal to the magnitude of the second voltage; and
reading the first fuse in response to the steps of providing the first, second, and third voltages.

11. A method as in claim 10, wherein the first fuse is electrically programmable.

12. A method as in claim 10, wherein the step of reading comprises comparing a current on the selected bitline and a plurality of currents on a plurality of non-selected bitlines.

13. A method as in claim 10, wherein a second fuse is coupled to the selected bitline and the non-selected wordline, and wherein the second fuse remains unread in response to the steps of providing the second and third voltages.

14. A method as in claim 13, wherein reading the first fuse does not program the second fuse.

15. A method as in claim 13, further comprising:
providing a fourth voltage to a non-selected bitline, wherein a magnitude of the fourth voltage is approximately equal to the magnitude of the first voltage.

16. A method as in claim 15, wherein a third fuse is coupled to the non-selected bitline and the non-selected wordline, and wherein the third fuse remains unread in response to the steps of providing the second and fourth voltages.

17. A method as in claim 16, wherein a fourth fuse is coupled to the non-selected bitline and the selected wordline, and wherein the fourth fuse remains unread in response to the steps of providing the first and fourth voltages.

18. A method as in claim 17, wherein reading the first fuse does not program the second, third, and fourth fuses.

19. A method for accessing a first fuse, the method comprising:
providing a plurality of fuses arranged in an array, the array comprising a plurality of fuse wordlines and bitlines, wherein the plurality of fuses comprise the first fuse;
providing a first voltage to a selected wordline;
providing a second voltage to a non-selected wordline, wherein a magnitude of the second voltage is greater than a magnitude of the first voltage; and
providing a third voltage to a selected bitline, wherein a magnitude of the third voltage is greater than or approximately equal to the magnitude of the second voltage.

20. A method as in claim 19, further comprising:
providing an address corresponding to the first fuse;
using the address to select the selected wordline; and
using the address to select the selected bitline.

* * * * *